(12) United States Patent
Hiyoshi

(10) Patent No.: US 12,484,286 B2
(45) Date of Patent: Nov. 25, 2025

(54) TRANSISTOR AND SEMICONDUCTOR DEVICE

(71) Applicant: SUMITOMO ELECTRIC INDUSTRIES, LTD., Osaka (JP)

(72) Inventor: Toru Hiyoshi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 774 days.

(21) Appl. No.: 17/792,160

(22) PCT Filed: Mar. 25, 2021

(86) PCT No.: PCT/JP2021/012554
§ 371 (c)(1),
(2) Date: Jul. 12, 2022

(87) PCT Pub. No.: WO2021/200543
PCT Pub. Date: Oct. 7, 2021

(65) Prior Publication Data
US 2023/0049852 A1 Feb. 16, 2023

(30) Foreign Application Priority Data

Mar. 30, 2020 (JP) .................................. 2020-060648

(51) Int. Cl.
*H01L 25/07* (2006.01)
*H01L 23/00* (2006.01)
(Continued)

(52) U.S. Cl.
CPC ......... *H10D 64/518* (2025.01); *H01L 25/072* (2013.01); *H10D 30/668* (2025.01);
(Continued)

(58) Field of Classification Search
None
See application file for complete search history.

(56) References Cited

U.S. PATENT DOCUMENTS

| 2016/0379992 | A1 | 12/2016 | Nagao et al. |
| 2018/0204910 | A1* | 7/2018 | Mitamura ............ H10D 12/481 |
| 2019/0288082 | A1* | 9/2019 | Sagawa ............... H10D 62/8325 |

FOREIGN PATENT DOCUMENTS

| JP | 2003-197914 A | 7/2003 |
| JP | 2017011007 A * | 1/2017 |

(Continued)

*Primary Examiner* — Sue A Purvis
*Assistant Examiner* — Jordan M Klein
(74) *Attorney, Agent, or Firm* — Renner, Otto, Boisselle & Sklar, LLP

(57) ABSTRACT

A transistor includes a wide bandgap semiconductor layer, a gate electrode, a gate pad, and a gate runner. The gate electrode extends to a region where the gate pad is located and a region where the gate runner is located. The gate pad is connected to the gate electrode. The gate runner is connected to the gate electrode. The gate electrode includes a first region connected to the gate pad, a second region connected to the gate runner, and a third region and a fourth region arranged between the first and second regions in different positions in a first direction. In a cross section perpendicular to the first direction, the gate electrode in the fourth region has a cross-sectional area smaller than that of the gate electrode in the third region.

14 Claims, 7 Drawing Sheets

(51) Int. Cl.
*H10D 30/66* (2025.01)
*H10D 62/832* (2025.01)
*H10D 64/27* (2025.01)
*H10D 64/66* (2025.01)

(52) U.S. Cl.
CPC ....... *H10D 62/8325* (2025.01); *H10D 64/661* (2025.01); *H01L 24/48* (2013.01); *H01L 2224/48175* (2013.01); *H01L 2224/48225* (2013.01); *H01L 2924/10272* (2013.01); *H01L 2924/12032* (2013.01); *H01L 2924/13091* (2013.01)

(56) References Cited

FOREIGN PATENT DOCUMENTS

| | | |
|---|---|---|
| JP | 2018-117025 A | 7/2018 |
| JP | 2019-161181 A | 9/2019 |
| WO | 2015/080162 A1 | 6/2015 |

* cited by examiner

TRANSISTOR AND SEMICONDUCTOR DEVICE

TECHNICAL FIELD

The present disclosure relates to a transistor and a semiconductor device.

The present application claims priority based on Japanese Patent Application No. 2020-60648 filed on Mar. 30, 2020, the entire contents of which are incorporated herein by reference.

BACKGROUND ART

A semiconductor device having a plurality of transistor cells is known (see, for example, Patent Literature 1).

CITATION LIST

Patent Literature

Patent Literature 1: International Patent Publication No. WO 2015/080162

SUMMARY OF INVENTION

A transistor according to the present disclosure includes: a wide bandgap semiconductor layer including a plurality of transistor cells having a channel region; a gate insulating film disposed on the wide bandgap semiconductor layer; a gate electrode disposed in a region opposing the channel region with the gate insulating film therebetween; an interlayer insulating film covering the wide bandgap semiconductor layer, the gate insulating film, and the gate electrode; a gate pad made of a conductive material, disposed on the interlayer insulating film; and a gate runner made of a conductive material, disposed in a position on the interlayer insulating film away from the gate pad. As viewed in a thickness direction of the wide bandgap semiconductor layer, the gate electrode extends from the region opposing the channel region to a region where the gate pad is located and a region where the gate runner is located. The interlayer insulating film includes a first opening arranged in the region where the gate pad is located and penetrating in a thickness direction of the interlayer insulating film, and a second opening arranged in the region where the gate runner is located and penetrating in the thickness direction of the interlayer insulating film. The gate pad is connected to the gate electrode by filling in the first opening. The gate runner is connected to the gate electrode by filling in the second opening. The gate electrode includes a first region connected to the gate pad, a second region connected to the gate runner, and a third region and a fourth region arranged between the first and second regions and in positions different from each other in a first direction which is indicated by a direction from the first region to the second region. In a cross section perpendicular to the first direction, the gate electrode in the fourth region has a cross-sectional area smaller than a cross-sectional area of the gate electrode in the third region.

DESCRIPTION OF EMBODIMENTS

Figure 1:
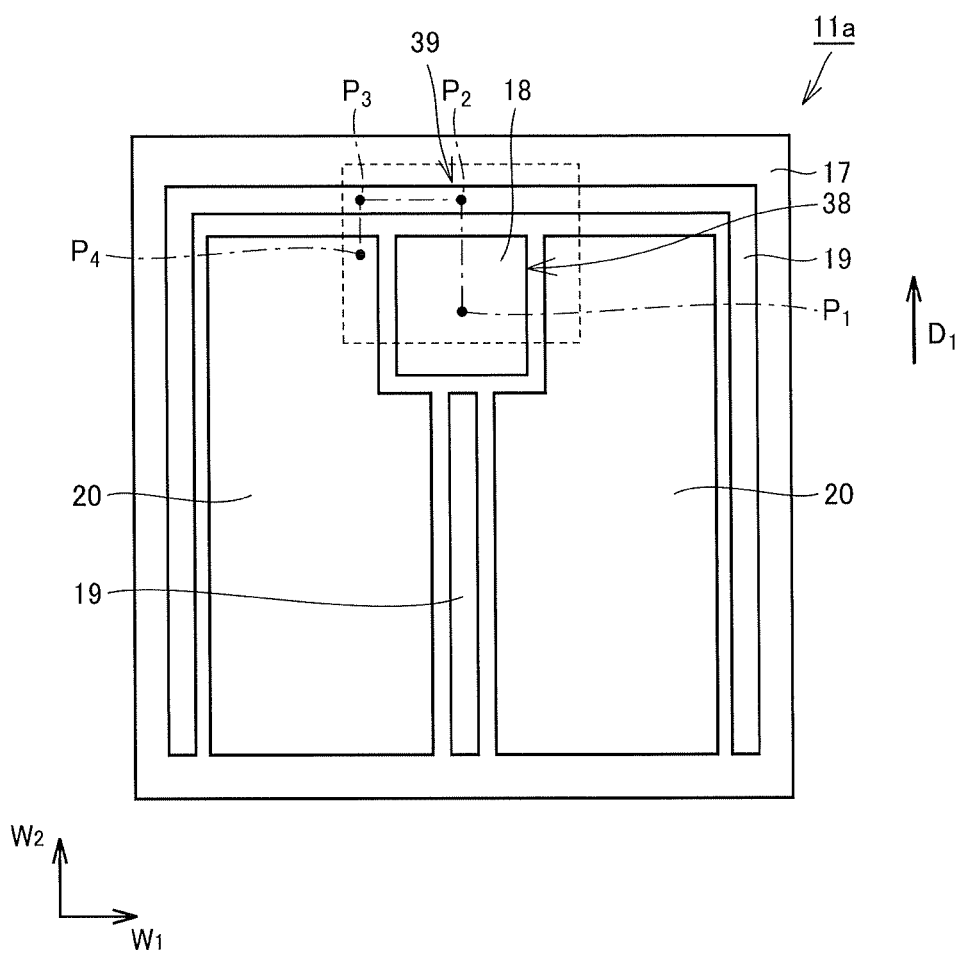
FIG. 1 is a schematic plan view of a transistor in Embodiment 1.

Problems to be Solved by Present Disclosure

The semiconductor device disclosed in Patent Literature 1 adopts a configuration in which the semiconductor chip contains a built-in resistor made of p-type polysilicon therein, from the standpoint of reducing generation of noise during the switching operation. In the semiconductor device disclosed in Patent Literature 1, the built-in resistor is disposed between a gate pad as the control pad and a gate finger, which is connected to a gate electrode as the control electrode, to electrically connect the gate finger and the gate pad. The gate electrode and the built-in resistor are physically located apart.

Such a configuration requires the gate electrode and the built-in resistor to be placed apart from each other in the semiconductor device, and also requires a region for the built-in resistor to be reserved. This leads to an increased area occupied by the gate pad as viewed in the thickness direction of the semiconductor layer, making it difficult to downsize the device. It is also required to reduce the effect of surge voltage during the switching operation.

Therefore, one of the objects is to provide a transistor that can reduce the effect of surge voltage and can readily be reduced in size.

Advantageous Effects of Present Disclosure

The above transistor is capable of reducing the effect of surge voltage and is readily reduced in size.

Description of Embodiments of Present Disclosure

First, embodiments of the present disclosure will be described and listed. A transistor according to the present disclosure includes: a wide bandgap semiconductor layer including a plurality of transistor cells having a channel region; a gate insulating film disposed on the wide bandgap semiconductor layer; a gate electrode disposed in a region opposing the channel region with the gate insulating film therebetween; an interlayer insulating film covering the wide bandgap semiconductor layer, the gate insulating film, and the gate electrode; a gate pad made of a conductive material, disposed on the interlayer insulating film; and a gate runner made of a conductive material, disposed in a position on the interlayer insulating film away from the gate pad. As viewed in a thickness direction of the wide bandgap semiconductor layer, the gate electrode extends from the region opposing the channel region to a region where the gate pad is located and a region where the gate runner is located. The interlayer insulating film includes a first opening arranged in the region where the gate pad is located and penetrating in a thickness direction of the interlayer insulating film, and a second opening arranged in the region where the gate runner is located and penetrating in the thickness direction of the interlayer insulating film. The gate pad is connected to the gate electrode by filling in the first opening. The gate runner is connected to the gate electrode by filling in the second opening. The gate electrode includes a first region connected to the gate pad, a second region connected to the gate runner, and a third region and a fourth region arranged between the first and second regions and in positions different from each other in a first direction which is indicated by a direction from the first region to the second region. In a cross section perpendicular to the first direction, the gate electrode in the fourth region has a cross-sectional area smaller than a cross-sectional area of the gate electrode in the third region.

According to the above transistor, the gate pad is connected to the gate electrode by filling in the first opening, and the gate runner is connected to the gate electrode by filling in the second opening. In the above transistor, the gate electrode includes the first region connected to the gate pad, the second region connected to the gate runner, and the third region and the fourth region arranged between the first and second regions and in positions different from each other in the first direction, indicated by the direction from the first region to the second region. In a cross section perpendicular to the first direction, the cross-sectional area of the gate electrode in the fourth region is smaller than that of the gate electrode in the third region. This enables the fourth region to function as an internal resistance of the transistor. In this case, the internal resistance in the fourth region can be adjusted to reduce the effect of surge voltage. It is also effective in suppressing ringing. Further, the fourth region serving as the internal resistance is not separated from the gate electrode but is integrated with the gate electrode, resulting in a reduced area occupied by the gate pad. As such, the above transistor is capable of reducing the effect of surge voltage and is readily reduced in size. It should be noted that the wide bandgap semiconductor layer refers to a semiconductor layer composed of a material having a larger bandgap than silicon.

In the above transistor, the gate electrode in the fourth region may have a through hole that penetrates in the thickness direction of the wide bandgap semiconductor layer. This makes it readily possible to reduce the cross-sectional area of the gate electrode in the fourth region by the through hole included in the gate electrode in the fourth region.

In the above transistor, the gate electrode in the fourth region may have a thickness smaller than that of the gate electrode in the third region. With this, the cross-sectional area of the fourth region can be easily reduced through adjustment in thickness of the gate electrode in the fourth region and in the third region.

In the above transistor, the wide bandgap semiconductor layer may be a SiC semiconductor layer, an AlN semiconductor layer, a GaN semiconductor layer, or a gallium oxide ($Ga_2O_3$) semiconductor layer. Such a wide bandgap semiconductor layer is capable of carrying a large current while ensuring a high breakdown voltage, so it is suitably used for the above transistor.

In the above transistor, a material for the gate electrode may be polysilicon. Polysilicon has its resistance easily controlled through adjustment of the concentration of impurities to be injected. This thus makes it readily possible to achieve a desired internal resistance.

In the above transistor, the gate electrode may have a constant impurity concentration. This facilitates production of the above transistor. Here, a constant impurity concentration means, for example, that the concentration of impurities is within the range of ±20% or less of a target central value.

A semiconductor device according to the present disclosure includes: an insulating substrate having a circuit pattern; and the above-described transistor disposed on the circuit pattern. In such a semiconductor device, the transistor includes the fourth region that functions as an internal resistance, eliminating the need to additionally provide a gate resistance in the circuit external to the transistor. This allows simplification of the production process.

Details of Embodiments of Present Disclosure

Embodiments of the transistor of the present disclosure will be described below with reference to the drawings. In the drawings referenced below, the same or corresponding parts are denoted by the same reference numerals and the descriptions thereof are not repeated.

Embodiment 1

Figure 2:
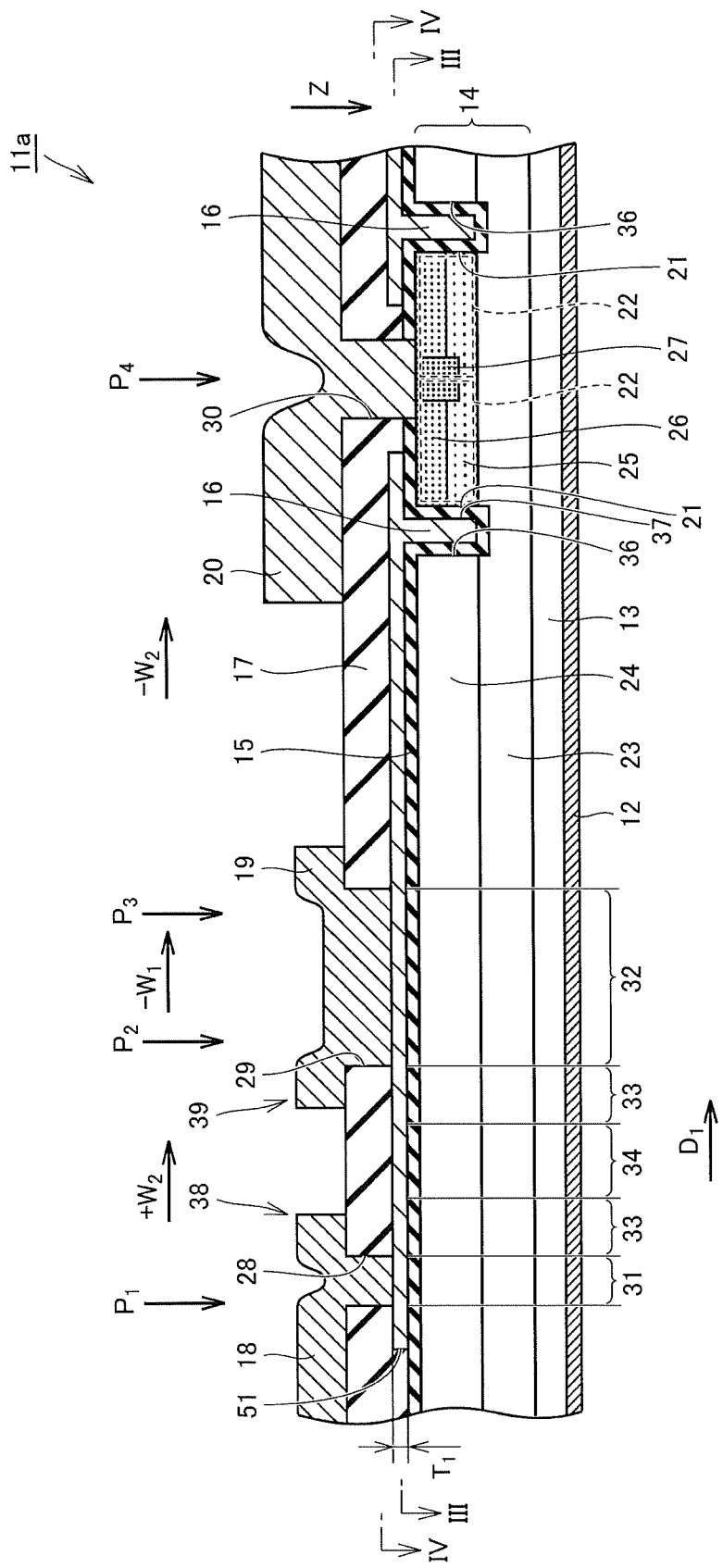
FIG. 2 is an enlarged cross-sectional view of a portion of the transistor shown in FIG. 1.
Figure 3:
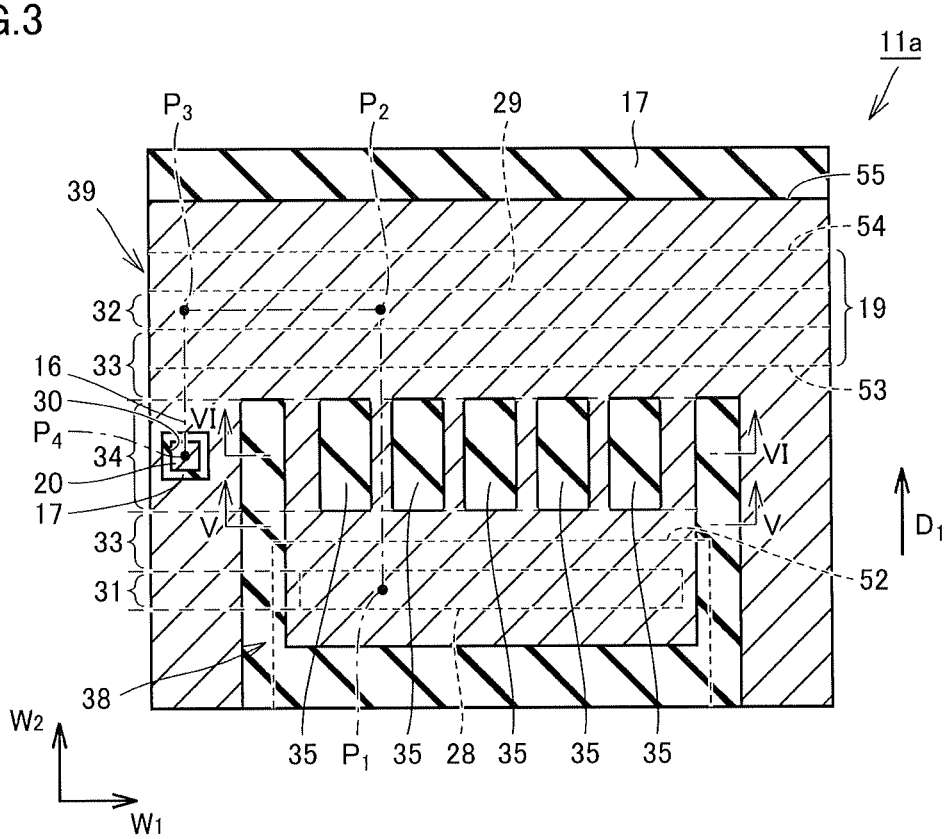
FIG. 3 is an enlarged cross-sectional view in a region enclosed by a dashed line in FIG. 1, taken along the line segment III-III in FIG. 2.
Figure 4:
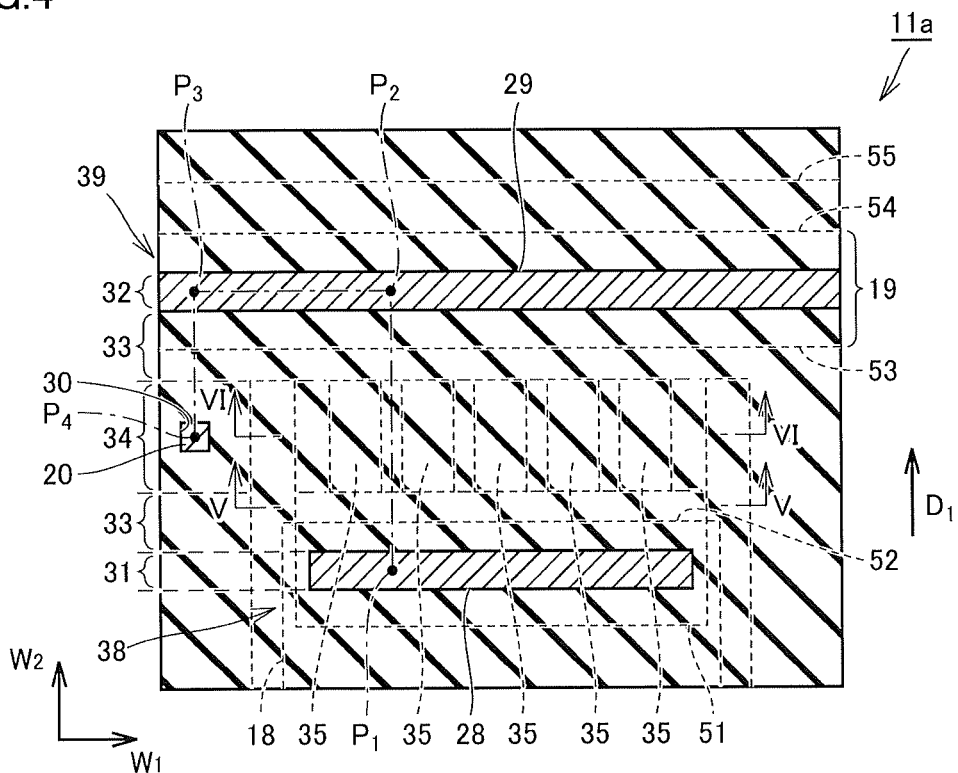
FIG. 4 is an enlarged cross-sectional view in the region enclosed by the dashed line in FIG. 1, taken along the line segment IV-IV in FIG. 2.

A transistor according to Embodiment 1 of the present disclosure will now be described. FIG. 1 is a schematic plan view of the transistor in Embodiment 1. FIG. 2 is an enlarged cross-sectional view of a portion of the transistor shown in FIG. 1. FIG. 3 is an enlarged cross-sectional view in a region enclosed by a dashed line in FIG. 1, taken along the line segment III-III in FIG. 2. FIG. 4 is an enlarged cross-sectional view in the region enclosed by the dashed line in FIG. 1, taken along the line segment IV-IV in FIG. 2. In FIG. 2, the direction of thickness of the wide bandgap semiconductor layer is indicated by the arrow Z. Further, a position $P_1$, a position $P_2$, a position $P_3$, and a position $P_4$ in FIG. 1 correspond to the positions $P_1$, $P_2$, $P_3$, and $P_4$ in FIGS. 2 to 4. In FIGS. 3 and 4, the transistor cells are partially enlarged and schematically illustrated for ease of understanding. In FIGS. 1, 3, and 4, arrows $W_1$ and $W_2$ are shown for clarification of the orientations. In the present embodiment, the arrows $W_1$ and $W_2$ are orthogonal to each other. In FIG. 2, the direction shown by the arrow $+W_2$ indicates the direction from the position $P_1$ to the position $P_2$, the direction shown by the arrow $-W_1$ indicates the direction from the position $P_2$ to the position $P_3$, and the direction shown by the arrow $-W_2$ indicates the direction from the position $P_3$ to the position $P_4$.

Referring to FIGS. 1 to 4, the transistor 11a according to Embodiment 1 is, for example, a metal-oxide-semiconductor field effect transistor (MOSFET), specifically a vertical MOSFET. The transistor 11a includes a drain electrode 12, a SiC substrate 13, a wide bandgap semiconductor layer 14, a gate insulating film 15, a gate electrode 16, an interlayer insulating film 17, a gate pad 18, a gate runner 19, and a source pad 20. The transistor 11a in the present embodiment adopts a trench gate structure. The wide bandgap semiconductor layer 14 has a trench 36 formed in a region where the gate electrode 16 is disposed. The trench 36 is composed of wall surfaces extending in a thickness direction of the wide bandgap semiconductor layer 14.

The wide bandgap semiconductor layer 14 is disposed on the SiC substrate 13. In the present embodiment, the wide bandgap semiconductor layer 14 is a SiC semiconductor layer. The wide bandgap semiconductor layer 14 includes a plurality of transistor cells 22 having a channel region 21. In the present embodiment, the channel regions 21 extend in the thickness direction of the wide bandgap semiconductor layer 14.

The drain electrode 12 is disposed on the SiC substrate 13 on a side opposite to the side where the wide bandgap semiconductor layer 14 is disposed. The drain electrode 12 is made of a conductive material.

The gate insulating film 15 is disposed on the wide bandgap semiconductor layer 14. The material for the gate insulating film 15 is $SiO_2$, for example.

The gate electrode 16 is disposed in a region opposing the channel region 21 with the gate insulating film 15 therebetween. The material for the gate insulating film 15 is polysilicon, for example. The gate electrode 16 has a constant impurity concentration.

The interlayer insulating film 17 is disposed to cover the wide bandgap semiconductor layer 14, the gate insulating film 15, and the gate electrode 16. The material for the interlayer insulating film 17 is $SiO_2$, for example. The direction of thickness of the interlayer insulating film 17 is indicated by the arrow Z in FIG. 2. That is, the thickness direction of the wide bandgap semiconductor layer 14 and the thickness direction of the interlayer insulating film 17 are the same.

The gate pad 18 is disposed on the interlayer insulating film 17. As viewed in the thickness direction of the wide bandgap semiconductor layer 14, the gate pad 18 has a rectangular external shape. The gate pad 18 is made of a conductive material. It should be noted that a boundary 52 of the gate pad 18 on the side where the gate runner 19 is located is shown in FIGS. 2 to 4.

The gate runner 19 is disposed on the interlayer insulating film 17, away from the gate pad 18. The gate runner 19 is made of a conductive material. It should be noted that a boundary 53 of the gate runner 19 on the side where the gate pad 18 is located and a boundary 54 of the gate runner 19 on an outer edge side opposite to the side where the gate pad 18 is located are shown in FIGS. 2 to 4.

The source pad 20 is disposed on the interlayer insulating film 17, away from the gate pad 18 and the gate runner 19. The source pads 20 are arranged side by side in the direction indicated by the arrow $W_1$. The source pads 20 are made of a conductive material. The gate runner 19 described above, with the exception of a part of it, is disposed on an outer circumference side of the source pads 20, spaced apart from the source pads 20. It should be noted that a boundary 55 of the source pad 20 on the side where the gate runner 19 is located is shown in FIG. 2.

Specific examples of the material adopted for the gate pad 18, the gate runner 19, and the source pad 20 include copper and aluminum.

The wide bandgap semiconductor layer 14 includes an $n^-$ drift region 23 arranged on the SiC substrate 13 side, and a $p^+$ contact region 24 arranged on the gate insulating film 15 side. The transistor cells 22 in the wide bandgap semiconductor layer 14 have a $p^-$ body region 25, an $n^+$ source region 26, and a $p^+$ contact region 27 formed by ion implantation, for example. The $p^-$ body region 25 includes the channel regions 21.

In the transistor 11a, a voltage is applied to the gate electrode 16 to generate an electric field in the channel regions 21, to control an electric current flowing from the source pad 20, through the $n^+$ source region 26, the $p^-$ body region 25, and the $n^-$ drift region 23 of the transistor cells 22, via the SiC substrate 13 to the drain electrode 12.

As viewed in the thickness direction of the wide bandgap semiconductor layer 14, the gate electrode 16 extends from a region 37 opposing the channel region 21, to a region where the gate pad 18 is located and a region where the gate runner 19 is located. More specifically, the gate electrode 16 extends to a boundary 51, which is its end in the region where the gate pad 18 is located. The gate electrode 16 also extends to a boundary 55, which is its end on the outer edge side of the region where the gate runner 19 is located. The interlayer insulating film 17 includes a first opening 28 that is arranged in the region where the gate pad 18 is located and penetrates in the thickness direction of the interlayer insulating film 17, and a second opening 29 that is arranged in the region where the gate runner 19 is located and penetrates in the thickness direction of the interlayer insulating film 17. The gate pad 18 is connected to the gate electrode 16 by filling in the first opening 28. The gate runner 19 is connected to the gate electrode 16 by filling in the second opening 29. The interlayer insulating film 17 includes a third opening 30 that is arranged in the region where the $p^+$ contact region 27 is located and penetrates in the thickness direction of the interlayer insulating film 17. The source pad 20 fills in the third opening 30.

Here, the gate electrode 16 includes: a first region 31 connected to the gate pad 18, a second region 32 connected to the gate runner 19, and a third region 33 and a fourth region 34 arranged between the first region 31 and the second region 32 and in positions different from each other in a first direction (indicated by the arrow $D_1$) which is indicated by a direction from the first region 31 to the second region 32. In a cross section perpendicular to the first direction, the gate electrode 16 in the fourth region 34 has a cross-sectional area smaller than that of the gate electrode 16 in the third region 33. In the present embodiment, the gate electrode 16 in the third region 33 has a thickness $T_1$ that is the same as a thickness $T_1$ of the gate electrode 16 in the fourth region 34.

Figure 5:
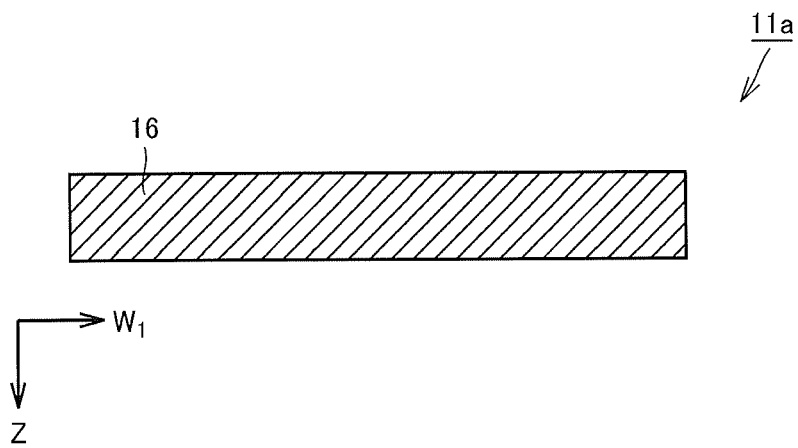
FIG. 5 is a schematic cross-sectional view of a gate electrode in a third region, taken along the line segment V-V in FIG. 3.
Figure 6:
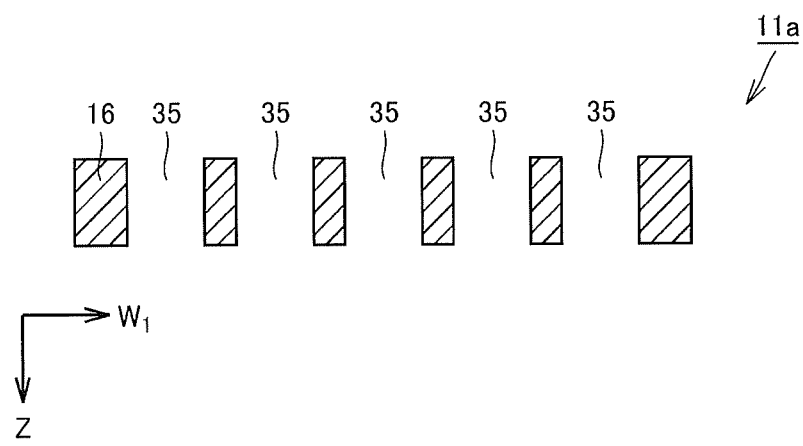
FIG. 6 is a schematic cross-sectional view of the gate electrode in a fourth region, taken along the line segment VI-VI in FIG. 3.

FIG. 5 is a schematic cross-sectional view of the gate electrode 16 in the third region 33, taken along the line segment V-V in FIG. 3. FIG. 6 is a schematic cross-sectional view of the gate electrode 16 in the fourth region 34, taken along the line segment VI-VI in FIG. 3. In FIG. 3, the direction from the first region 31 to the second region 32 is indicated by the arrow $D_1$. The direction shown by the arrow $D_1$ is the same as that shown by the arrow $W_2$. FIGS. 5 and 6 are cross sections perpendicular to the first direction.

Referring to FIGS. 3 to 6, in the present embodiment, the gate electrode 16 in the fourth region 34 has a through hole 35 that penetrates in the thickness direction of the wide bandgap semiconductor layer 14. The wall surfaces constituting the through hole 35 represent a rectangular shape as viewed in the thickness direction of the wide bandgap semiconductor layer 14. A plurality of such through holes 35 are formed. The plurality of through holes 35 are spaced apart from each other in a direction perpendicular to the direction shown by the arrow $D_1$. In the present embodiment, five through holes 35 are formed. The cross-sectional area of the gate electrode 16 in the fourth region 34 is smaller than that of the gate electrode 16 in the third region 33 by the area occupied by the through holes 35.

According to the above transistor 11a, the gate pad 18 is connected to the gate electrode 16 by filling in the first opening 28, and the gate runner 19 is connected to the gate electrode 16 by filling in the second opening 29. In the above transistor 11a, the gate electrode 16 includes the first region 31 connected to the gate pad 18, the second region 32 connected to the gate runner 19, and the third region 33 and the fourth region 34 arranged between the first region 31 and the second region 32 and located at different positions in the first direction, which is indicated by the direction from the first region 31 to the second region 32. In a cross section perpendicular to the first direction, the cross-sectional area of the gate electrode 16 in the fourth region 34 is smaller than that of the gate electrode 16 in the third region 33. This allows the fourth region 34 to function as an internal resistance of the transistor 11a. In this case, the internal resistance in the fourth region 34 can be adjusted to reduce the effect of surge voltage due to jumping of the voltage. It is also effective in suppressing ringing. In addition, the fourth region 34 serving as the internal resistance is not separated from the gate electrode 16 but is integrated with the gate electrode 16. This results in a reduced area occupied by the gate pad 18. Therefore, the above transistor 11a is capable of reducing the effect of surge voltage and is readily reduced in size.

The transistor 11a in Embodiment 1 is produced, for example, as briefly described below. First, a SiC substrate 13 is prepared, and a wide bandgap semiconductor layer 14 is formed on one surface of the substrate. Subsequently, in the region where transistor cells 22 are to be disposed, doping is performed by ion implantation to form a p⁻ body region 25, an n⁺ source region 26, and a p⁺ contact region 27. Next, a trench 36 is formed, which is followed by formation of a gate insulating film 15 and then a gate electrode 16 composed of polysilicon. At this time, as viewed in the thickness direction of the wide bandgap semiconductor layer 14, the gate electrode 16 is formed to reach the region where a gate pad 18 is to be located and the region where a gate runner 19 is to be located. Next, a through hole 35 is formed in the position corresponding to the fourth region of the gate electrode 16, and then an interlayer insulating film 17 is formed to cover the wide bandgap semiconductor layer 14, the gate insulating film 15, and the gate electrode 16. Thereafter, a first opening 28, a second opening 29, and a third opening 30 are formed, a source electrode capable of ohmic contact is formed, and a drain electrode is formed on the other surface of the SiC substrate 13. Next, the gate pad 18, the gate runner 19, and the source pad 20 are formed at predetermined locations, whereby the transistor 11a is produced.

In the present embodiment, the gate electrode 16 in the fourth region 34 has the through holes 35 that penetrate in the thickness direction of the wide bandgap semiconductor layer 14. The transistor 11a thus is a transistor that can readily be reduced in cross-sectional area of the fourth region 34 with the through holes 35 included in the gate electrode 16 in the fourth region 34.

In the present embodiment, the wide bandgap semiconductor layer 14 is a SiC semiconductor layer. The transistor 11a thus is a transistor that can carry a large current while ensuring a high breakdown voltage.

In the present embodiment, the material for the gate electrode 16 is polysilicon. Polysilicon has its resistance easily controlled through adjustment of the concentration of impurities to be injected. The transistor 11a thus is a transistor that can readily be made to have a desired internal resistance.

In the above transistor 11a, the gate electrode 16 has a constant impurity concentration. This facilitates the production of the transistor 11a.

In the above embodiment, the wall surfaces constituting the through hole 35 represent a rectangular shape as viewed in the thickness direction of the wide bandgap semiconductor layer 14. However, not limited to this, the wall surfaces constituting the through hole 35 may be of a square shape, a round shape, or an oval shape. Further, the plurality of through holes 35 may be a combination of different shapes of holes. Furthermore, there may be a single through hole 35.

In the above embodiment, the trench 36 is composed of the wall surfaces that extend in a vertical direction, i.e., in the thickness direction of the wide bandgap semiconductor layer 14. However, not limited to this, the wall surfaces constituting the trench 36 may be inclined with respect to the thickness direction of the wide bandgap semiconductor layer 14 so as to have an increased area on the opening side. More specifically, the trench 36 may be configured such that the opening area decreases toward the SiC substrate 13 side as viewed in the thickness direction of the wide bandgap semiconductor layer 14, for example.

Embodiment 2

Figure 7:
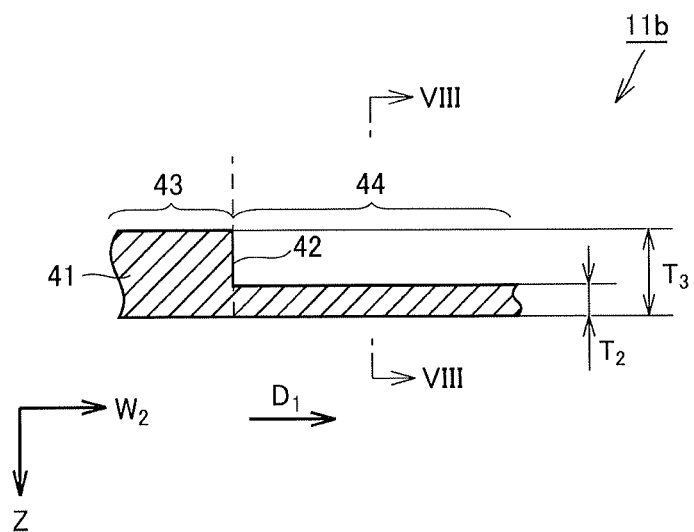
FIG. 7 is a schematic cross-sectional view of a portion of the gate electrode included in a transistor in Embodiment 2.
Figure 8:
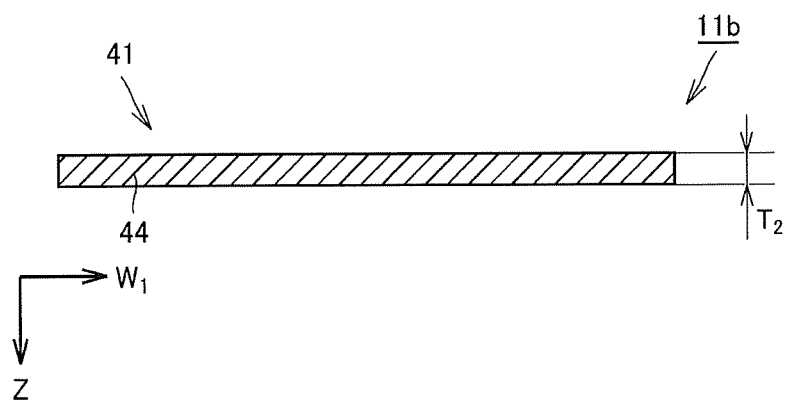
FIG. 8 is a schematic cross-sectional view of the fourth region, taken along the line segment VIII-VIII in FIG. 7.

A description will now be made of another embodiment, Embodiment 2. FIG. 7 is a schematic cross-sectional view of a portion of the gate electrode included in a transistor in Embodiment 2. FIG. 8 is a schematic cross-sectional view taken along the line segment VIII-VIII in FIG. 7. The transistor in Embodiment 2 differs from that in Embodiment 1 in that no through hole is formed in the gate electrode in the fourth region and that the gate electrode in the fourth region is thinner in thickness than the gate electrode in the third region.

Referring to FIGS. 7 and 8, in a gate electrode 41 included in the transistor 11b in Embodiment 2, a step 42 is formed between the gate electrode 41 in a third region 43 and the gate electrode 41 in a fourth region 44, and the gate electrode 41 in the fourth region 44 has a thickness $T_2$ that is smaller than a thickness $T_3$ of the gate electrode 41 in the third region 43. Such a transistor 11b is a transistor in which the cross-sectional area of the gate electrode 41 in the fourth region 44 can readily be reduced by adjusting the thickness $T_2$ of the gate electrode 41 in the fourth region 44 and the thickness $T_3$ of the gate electrode 41 in the third region 43.

Embodiment 3

Figure 9:
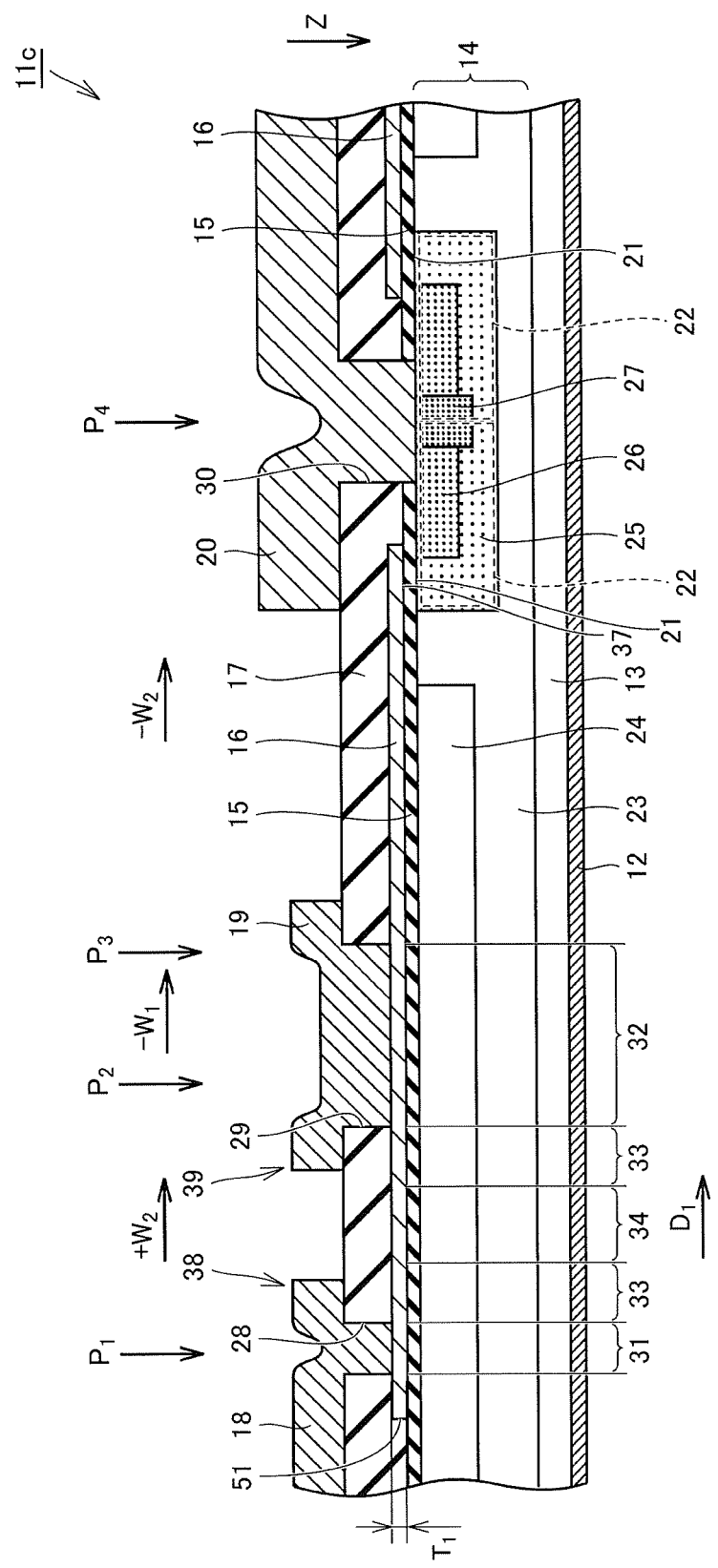
FIG. 9 is a schematic cross-sectional view of a portion of a semiconductor device including a transistor in Embodiment 3.

A description will now be made of yet another embodiment, Embodiment 3. FIG. 9 is a schematic cross-sectional view of a portion of a transistor in Embodiment 3. The transistor in Embodiment 3 differs from that in Embodiment 1 in that a planar gate structure is adopted.

Referring to FIG. 9, the transistor 11c in Embodiment 3 includes a drain electrode 12, a SiC substrate 13, a wide bandgap semiconductor layer 14, a gate insulating film 15, a gate electrode 16, an interlayer insulating film 17, a gate pad 18, a gate runner 19, and a source pad 20. The transistor 11c in the present embodiment has a planar gate structure. Channel regions 21, unlike those in the transistor 11a in Embodiment 1, extend along a plane that is perpendicular to the thickness direction of the wide bandgap semiconductor layer 14.

In the transistor 11c of such a configuration as well, the effect of surge voltage can be reduced, and the size can readily be reduced.

Embodiment 4

Figure 10:
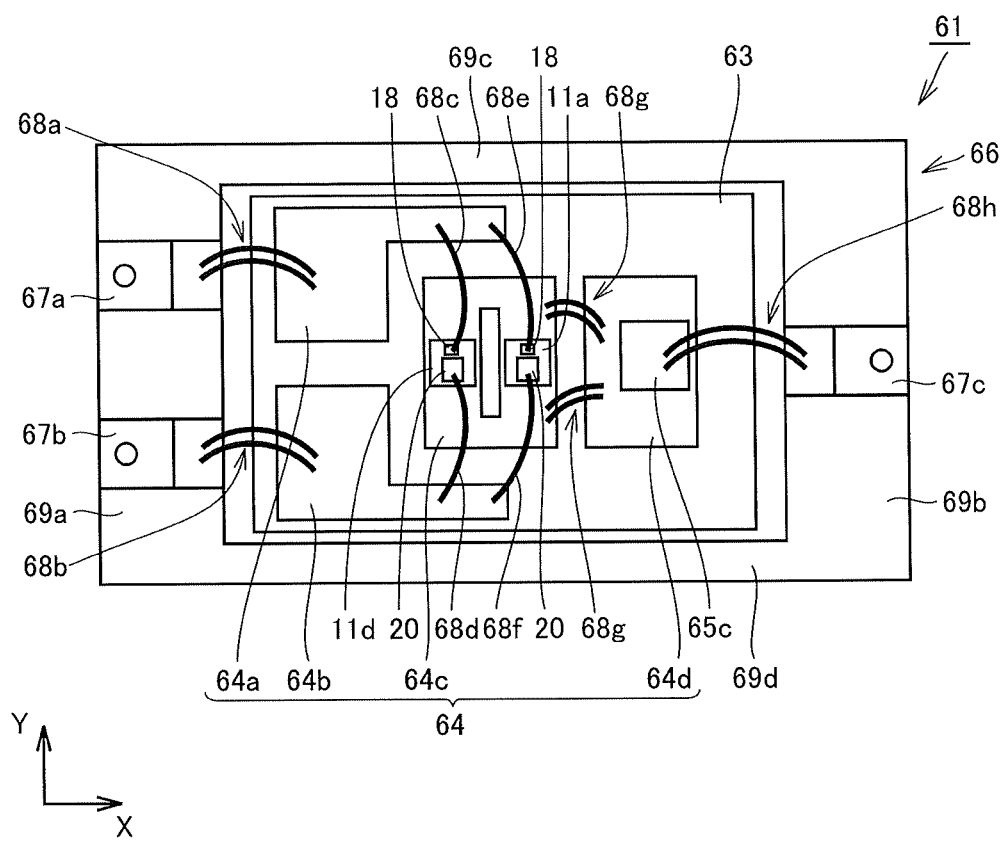
FIG. 10 is a schematic plan view of a portion of a semiconductor device in Embodiment 4.

A description will now be made of yet another embodiment, Embodiment 4. FIG. 10 is a schematic plan view of a semiconductor device that includes the transistor in Embodiment 1, when viewed in the thickness direction of the substrate.

Referring to FIG. 10, a semiconductor device 61 is disposed on a heat dissipation plate, and includes: an insulating substrate 63 having a circuit pattern 64, the transistor 11a described above, a transistor 11d having a similar configuration as the transistor 11a, a Schottky barrier diode 65c, a plurality of terminals 67a, 67b, 67c, a plurality of wires 68a, 68b, 68c, 68d, 68e, 68f, 68g, 68h, and a case 66. In the transistors 11a and 11d, the gate runner 19 is omitted from the figure and the gate pad 18 and the source pad 20 are simplified in the figure.

The case 66 is made of, for example, resin having insulating properties. In the present embodiment, the case 66 is of a rectangular tube shape longer in the X direction than in the Y direction. The case 66 includes a first wall portion 69a, a second wall portion 69b, a third wall portion 69c, and a fourth wall portion 69d. The first wall portion 69a and the second wall portion 69b are arranged to oppose each other in the X direction. The third wall portion 69c and the fourth wall portion 69d are arranged to oppose each other in the Y direction. The case 66 is attached to the heat dissipation plate by an adhesive, for example. It should be noted that in FIG. 10, the Z direction in FIGS. 1 to 9 is the direction orthogonal to each of the X direction and the Y direction.

The insulating substrate 63 is disposed in a region surrounded by the first to fourth wall portions 69a to 69d. The insulating substrate 63 is made of ceramic, for example.

The circuit pattern 64 is arranged in contact with one surface of the insulating substrate 63 in the thickness direction of the insulating substrate 63. The circuit pattern 64 is composed of a plurality of circuit plates. In the present embodiment, the circuit pattern 64 specifically includes a first circuit plate 64a, a second circuit plate 64b, a third circuit plate 64c, and a fourth circuit plate 64d. In the present embodiment, the circuit pattern 64 is so-called copper interconnections.

The transistors 11a and 11d are each joined to the third circuit plate 64c. The Schottky barrier diode 65c is joined to the fourth circuit plate 64d.

The Schottky barrier diode 65c has a cathode electrode disposed on an opposing surface side opposing the fourth circuit plate 64d, and an anode electrode disposed on a surface on the opposite side of the opposing surface in the thickness direction of the insulating substrate 63.

In the transistor 11a, the drain electrode is disposed on an opposing surface opposing the third circuit plate 64c. The transistor 11a includes the source pad 20 and the gate pad 18.

The terminals 67a to 67c are made of metal. In the present embodiment, the terminals 67a to 67c are each formed, for example, by bending a flat metal member. In the semiconductor device 61, the use of the terminals 67a to 67c secures electrical connection with the outside. The three terminals 67a to 67c are each attached to the case 66. More specifically, the terminal 67a and the terminal 67b are attached to the first wall portion 69a of the case 66, spaced apart from each other in the Y direction. The terminal 67c is attached to the second wall portion 69b.

The terminal 67a and the first circuit plate 64a are electrically connected via the wire 68a. The terminal 67b and the second circuit plate 64b are electrically connected via the wire 68b. The gate pad 18 of the transistor 11d and the first circuit plate 64a are electrically connected via the wire 68c. The source pad 20 of the transistor 11d and the second circuit plate 64b are electrically connected via the wire 68d. The drain electrode of the transistor 11d, located on its surface opposite to the side where the gate pad 18 and the source pad 20 are located, and the third circuit plate 64c are electrically connected. The gate pad 18 of the transistor 11a and the first circuit plate 64a are electrically connected via the wire 68e. The source pad 20 of the transistor 11a and the second circuit plate 64b are electrically connected via the wire 68f. The drain electrode of the transistor 11a, located on its surface opposite to the side where the gate pad 18 and the source pad 20 are located, and the third circuit plate 64c are electrically connected. The third circuit plate 64c and the fourth circuit plate 64d are connected via the wire 68g. The cathode electrode of the Schottky barrier diode 65c and the fourth circuit plate 64d are electrically connected. The anode electrode of the Schottky barrier diode 65c and the terminal 67c are electrically connected via the wire 68h. The wires 68a to 68h are each bonded to the transistor 11a or other member by ultrasonic bonding, for example.

According to the semiconductor device 61 with this configuration, the transistors 11a and 11d each include the fourth region 34, which functions as an internal resistance, eliminating the need to additionally provide a member corresponding to the gate resistance in a circuit external to the transistor 11a. The production process can thus be simplified.

Other Embodiments

In the above embodiments, the wide bandgap semiconductor layer 14 is a SiC semiconductor layer. However, not limited to this, the wide bandgap semiconductor layer 14 may be a SiC semiconductor layer, an AlN semiconductor layer, a GaN semiconductor layer, or a gallium oxide ($Ga_2O_3$) semiconductor layer. Such a wide bandgap semiconductor layer 14 is capable of carrying a large current while ensuring a high breakdown voltage, and is suitably used for the above transistor.

In the above embodiments, the transistor is a MOSFET. However, not limited to this, the transistor may be, for example, an insulated gate bipolar transistor (IGBT).

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 11a, 11b, 11c, 11d transistor
12 drain electrode
13 SiC substrate
14 wide bandgap semiconductor layer
15 gate insulating film
16, 41 gate electrode
17 interlayer insulating film
18 gate pad
19 gate runner
20 source pad
21 channel region 22 transistor cell
23 n⁻ drift region
24, 27 p⁺ contact region
25 p⁻ body region
26 n⁺ source region
28 first opening
29 second opening
30 third opening
31 first region
32 second region
33, 43 third region
34, 44 fourth region
35 through hole
36 trench
37, 38, 39 region
42 step
51, 52, 53, 54, 55 boundary
61 semiconductor device
63 insulating substrate
64 circuit pattern
64a first circuit plate
64b second circuit plate
64c third circuit plate
64d fourth circuit plate
65c Schottky barrier diode
66 case
67a, 67b, 67c terminal
68a, 68b, 68c, 68d, 68e, 68f, 68g, 68h wire
69a first wall portion
69b second wall portion
69c third wall portion
69d fourth wall portion
$D_1$, $W_1$, $W_2$, X, Y, Z arrow
$P_1$, $P_2$, $P_3$, $P_4$ position
$T_1$, $T_2$, $T_3$ thickness

The invention claimed is:

1. A transistor comprising:
a wide bandgap semiconductor layer including a plurality of transistor cells having a channel region;
a gate insulating film disposed on the wide bandgap semiconductor layer;
a gate electrode disposed in a region opposing the channel region with the gate insulating film therebetween;
an interlayer insulating film covering the wide bandgap semiconductor layer, the gate insulating film, and the gate electrode;
a gate pad made of a conductive material, disposed on the interlayer insulating film; and
a gate runner made of a conductive material, disposed in a position on the interlayer insulating film away from the gate pad;
as viewed in a thickness direction of the wide bandgap semiconductor layer, the gate electrode extending from the region opposing the channel region to a region where the gate pad is located and a region where the gate runner is located,
the interlayer insulating film including a first opening arranged in the region where the gate pad is located and penetrating in a thickness direction of the interlayer insulating film, and a second opening arranged in the region where the gate runner is located and penetrating in the thickness direction of the interlayer insulating film,
the gate pad being connected to the gate electrode by filling in the first opening,
the gate runner being connected to the gate electrode by filling in the second opening,
the gate electrode including
a first region connected to the gate pad,
a second region connected to the gate runner,
a two third regions, and
a fourth region arranged between the two third regions,
wherein the two third regions and the fourth region are arranged between the first and second regions and in positions different from each other in a first direction which is indicated by a direction from the first region to the second region,
in a cross section perpendicular to the first direction, the gate electrode in the fourth region having a cross-sectional area smaller than a cross-sectional area of the gate electrode in the two third regions,
wherein the gate electrode in the fourth region has a through hole that penetrates in the thickness direction of the wide bandgap semiconductor layer.

2. The transistor according to claim 1, wherein the wide bandgap semiconductor layer is a SiC semiconductor layer, an AlN semiconductor layer, a GaN semiconductor layer, or a gallium oxide semiconductor layer.

3. The transistor according to claim 2, wherein a material for the gate electrode is polysilicon.

4. The transistor according to claim 2, wherein the gate electrode has a constant impurity concentration.

5. The transistor according to claim 1, wherein a material for the gate electrode is polysilicon.

6. The transistor according to claim 5, wherein the gate electrode has a constant impurity concentration.

7. The transistor according to claim 1, wherein the gate electrode has a constant impurity concentration.

8. A semiconductor device comprising:
an insulating substrate having a circuit pattern; and
the transistor according to claim 1 disposed on the circuit pattern.

9. The transistor according to claim 1, wherein the gate electrode in the fourth region has a thickness smaller than a thickness of the gate electrode in the third region.

10. A transistor comprising:
a wide bandgap semiconductor layer including a plurality of transistor cells having a channel region;
a gate insulating film disposed on the wide bandgap semiconductor layer;
a gate electrode disposed in a region opposing the channel region with the gate insulating film therebetween;
an interlayer insulating film covering the wide bandgap semiconductor layer, the gate insulating film, and the gate electrode;
a gate pad made of a conductive material, disposed on the interlayer insulating film; and
a gate runner made of a conductive material, disposed in a position on the interlayer insulating film away from the gate pad;
as viewed in a thickness direction of the wide bandgap semiconductor layer, the gate electrode extending from the region opposing the channel region to a region where the gate pad is located and a region where the gate runner is located,
the interlayer insulating film including a first opening arranged in the region where the gate pad is located and penetrating in a thickness direction of the interlayer insulating film, and a second opening arranged in the region where the gate runner is located and penetrating in the thickness direction of the interlayer insulating film,
the gate pad being connected to the gate electrode by filling in the first opening, the gate runner being connected to the gate electrode by filling in the second opening, the gate electrode including
- a first region connected to the gate pad,
- a second region connected to the gate runner,
- two third regions, and
- a fourth region arranged between the two third regions, wherein the two third regions and the fourth region are arranged between the first and second regions and in positions different from each other in a first direction which is indicated by a direction from the first region to the second region, in a cross section perpendicular to the first direction, the gate electrode in the fourth region having a cross-sectional area smaller than a cross-sectional area of the gate electrode in the two third regions, wherein the gate electrode in the fourth region has a thickness smaller than a thickness of the gate electrode in the two third regions.

11. The transistor according to claim 10, wherein the wide bandgap semiconductor layer is a SiC semiconductor layer, an AlN semiconductor layer, a GaN semiconductor layer, or a gallium oxide semiconductor layer.

12. The transistor according to claim 10, wherein a material for the gate electrode is polysilicon.

13. The transistor according to claim 10, wherein the gate electrode has a constant impurity concentration.

14. A semiconductor device comprising:
an insulating substrate having a circuit pattern; and
the transistor according to claim 10 disposed on the circuit pattern.

* * * * *